(12) United States Patent
Botti

(10) Patent No.: US 9,602,096 B2
(45) Date of Patent: Mar. 21, 2017

(54) POWER ELECTRONIC DEVICE WITH IMPROVED EFFICIENCY AND ELECTROMAGNETIC RADIATION CHARACTERISTICS

(71) Applicant: STMICROELECTRONICS S.R.L., Agrate Brianza (IT)

(72) Inventor: Edoardo Botti, Vigevano (IT)

(73) Assignee: STMICROELECTRONICS S.R.L., Agrate Brianza (MB) (IT)

(*) Notice: Subject to any disclaimer, the term of this patent is extended or adjusted under 35 U.S.C. 154(b) by 104 days.

(21) Appl. No.: 14/337,991

(22) Filed: Jul. 22, 2014

(65) Prior Publication Data
US 2015/0035580 A1 Feb. 5, 2015

(30) Foreign Application Priority Data
Jul. 31, 2013 (IT) .............. MI2013A1283

(51) Int. Cl.
| | |
|---|---|
| *H03K 17/04* | (2006.01) |
| *H03K 17/0412* | (2006.01) |
| *H01L 21/8238* | (2006.01) |
| *H03K 17/0416* | (2006.01) |
| *H03K 17/687* | (2006.01) |
| *H03F 1/02* | (2006.01) |

(Continued)

(52) U.S. Cl.
CPC ........... *H03K 17/04123* (2013.01); *H01L 21/823871* (2013.01); *H03F 1/0205* (2013.01); *H03F 1/523* (2013.01); *H03F 3/2173* (2013.01); *H03K 17/04163* (2013.01); *H03K 17/6872* (2013.01); *H03K 17/162* (2013.01); *H03K 2217/0009* (2013.01); *H03K 2217/0036* (2013.01)

(58) Field of Classification Search
None
See application file for complete search history.

(56) References Cited

U.S. PATENT DOCUMENTS 4,426,589 A * 1/1984 Moder ............ H03K 17/08146
327/412
4,626,715 A * 12/1986 Ishii ................ H03K 17/04163
327/437

(Continued)

FOREIGN PATENT DOCUMENTS

EP 1796160 6/2007

*Primary Examiner* — Thomas J Hiltunen
(74) *Attorney, Agent, or Firm* — Slater Matsil, LLP

(57) ABSTRACT

A power electronic device includes first and second electronic switches, each integrated on a package having a low parasitic inductance, a supply terminal and a ground terminal. The first conduction terminal of the first switch may be coupled with the supply terminal, and the second conduction terminal of the second electronic switch may be coupled with the ground terminal. The corresponding control terminals of the switches may be coupled to corresponding pilot drivers. The package may include first and second electric terminals, wherein the second conduction terminal of the first switch is coupled to the first electric terminal, and the first conduction terminal of the second switch is coupled to the second electric terminal. A first inductance may be interposed between the first electric terminal and the output terminal and/or a second inductance interposed between the second electric terminal and the output terminal.

35 Claims, 10 Drawing Sheets

(51) Int. Cl.
    *H03F 1/52*      (2006.01)
    *H03F 3/217*     (2006.01)
    *H03K 17/16*     (2006.01)

(56) References Cited

U.S. PATENT DOCUMENTS

| | | | | |
|---|---|---|---|---|
| 5,107,151 A * | 4/1992 | Cambier | .......... | H03K 17/08142 327/432 |
| 5,202,820 A * | 4/1993 | Miller | .............. | H03K 17/08142 363/132 |
| 5,479,337 A * | 12/1995 | Voigt | .................... | H03F 3/2176 323/235 |
| 5,946,208 A * | 8/1999 | Yamamoto | ............. | A61B 6/488 363/132 |
| 6,069,472 A * | 5/2000 | Pernyeszi | ............... | H02M 7/48 323/282 |
| 6,304,137 B1 * | 10/2001 | Pullen | ..................... | H02M 1/44 330/10 |
| 6,377,107 B1 * | 4/2002 | Franck | .................... | H02M 7/5383 315/209 R |
| 7,189,012 B2 * | 3/2007 | Kuhara | ................... | G02B 6/4201 372/43.01 |
| 7,332,943 B2 | 2/2008 | Botti et al. | | |
| 7,511,390 B1 * | 3/2009 | Walter | .................... | H02M 1/44 307/112 |
| 7,581,198 B2 * | 8/2009 | Huynh | ................... | G06F 17/5072 716/119 |
| 7,679,944 B2 * | 3/2010 | Sakurai | ................... | H02M 1/08 257/361 |
| 7,825,508 B2 * | 11/2010 | Hebert | ............. | H01L 23/49562 257/724 |
| 7,852,125 B2 * | 12/2010 | Lopez | .................... | H02M 1/08 327/108 |
| 7,904,864 B2 * | 3/2011 | Huynh | ................ | G06F 17/5072 716/118 |
| 7,911,066 B2 * | 3/2011 | Ehlers | ................ | H01L 23/3677 257/774 |
| 8,203,380 B2 * | 6/2012 | Hashimoto | ......... | H01L 27/0629 327/109 |
| 8,283,905 B2 * | 10/2012 | Chang | .................. | H02M 3/156 323/273 |
| 8,406,024 B2 * | 3/2013 | Nakamura | ........... | H02M 7/537 363/131 |
| 8,547,162 B2 * | 10/2013 | Korec | ................ | H01L 27/0629 327/108 |
| 8,970,790 B2 * | 3/2015 | Murakami | ......... | H02M 3/1563 323/271 |
| 9,093,900 B2 * | 7/2015 | Hegarty | ........... | H01L 23/49524 |
| 9,178,424 B2 * | 11/2015 | Schmeller | ............. | H02M 3/158 |
| 2006/0044856 A1 * | 3/2006 | Bird | .................... | H02M 3/1588 363/131 |
| 2011/0148376 A1 * | 6/2011 | Xu | ....................... | H03K 17/165 323/282 |
| 2012/0091986 A1 | 4/2012 | Takemae et al. | | |
| 2014/0253186 A1 * | 9/2014 | De Geeter | ........ | H03K 17/6871 327/110 |
| 2015/0042403 A1 * | 2/2015 | Laturell | ............... | H03F 3/2175 330/251 |
| 2016/0118961 A1 * | 4/2016 | Nagasato | ........... | H03K 17/687 318/504 |

\* cited by examiner

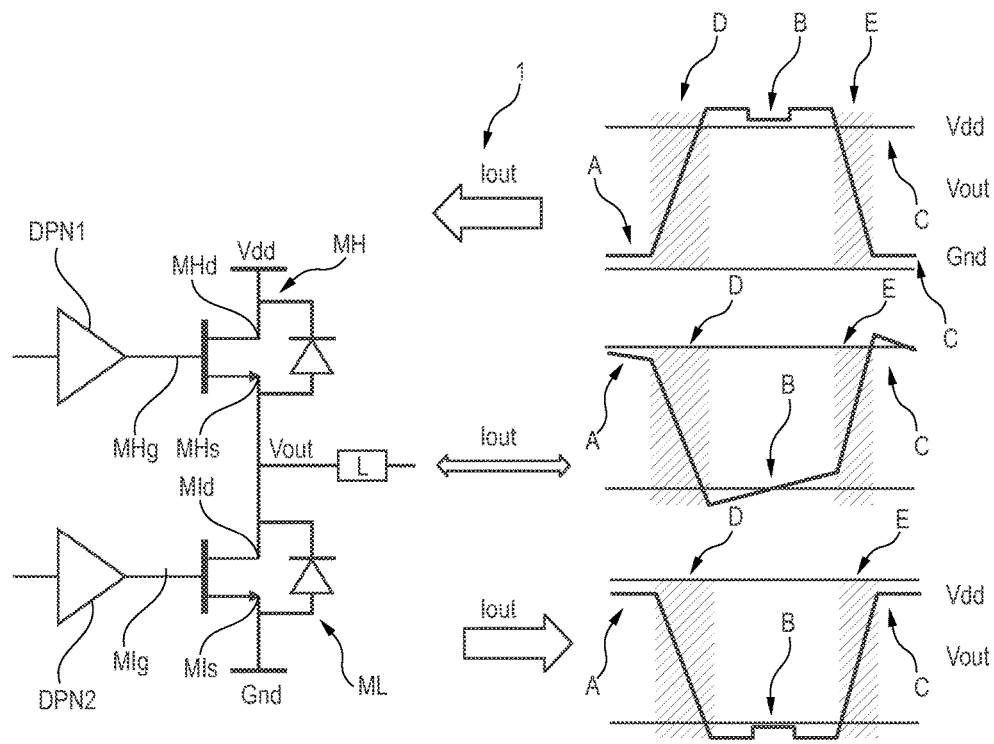
Fig. 1A (PRIOR ART)
Fig. 1B (PRIOR ART)
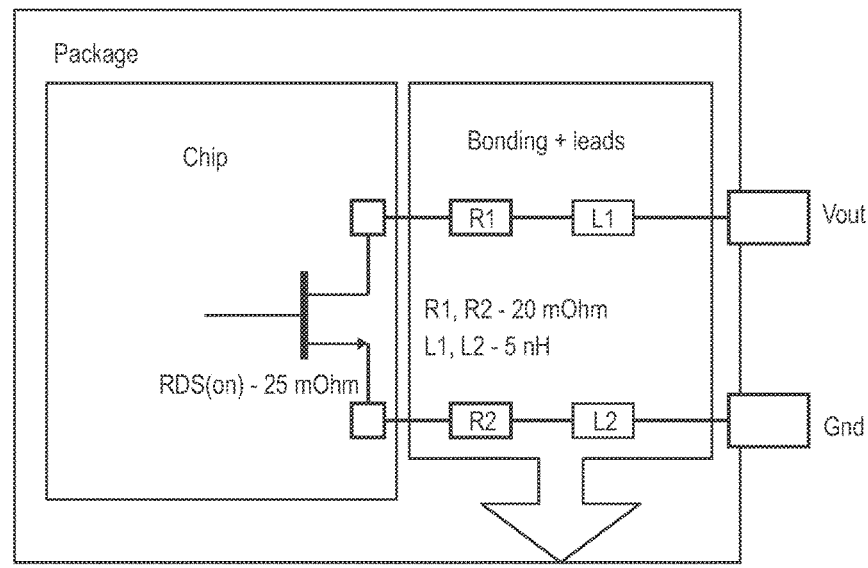
Fig. 2 (PRIOR ART)

POWER ELECTRONIC DEVICE WITH IMPROVED EFFICIENCY AND ELECTROMAGNETIC RADIATION CHARACTERISTICS

FIELD OF THE INVENTION

The present description relates to a switching output stage with improved efficiency and electromagnetic radiation characteristics.

BACKGROUND OF THE INVENTION

As it is known, power stages operating in switching mode are quickly replacing the so-called "linear" systems by virtue of their higher efficiency. The most common cases of electronic devices operating based on "switching" techniques are voltage adjusters and audio power amplifiers.

The need is increasingly felt by users, to have switching devices having reduced dimensions with regards to the dissipating devices and the output inductances. This involves the manufacturers producing devices that reduce the dissipated power and increase the switching frequency.

For the characteristics of the switching devices, these requirements are conflicting, since, as the switching frequency increases, the losses due to the switching also increase, thus the efficiency of the same device is reduced.

Another point to be considered relates to the electromagnetic radiation of the device, which generally increases as the switching speed increases, i.e., as the switching frequency increases.

Particularly, also with reference to FIG. 1A, in which an output block of these electronic power devices is shown, a first electronic switch MH and a second electronic switch ML are shown. Each electronic switch has a first conduction terminal MHd, MLd, and a second conduction terminal MHs, MLs and a command or control terminal MHg, MLg, in which the first conduction terminal MHd of the first electronic switch MH is connected with a supply terminal Vdd, and the second conduction terminal MLs of the second electronic switch ML is connected with a ground terminal GND. The corresponding command terminals MHg, MLg of the first and second electronic switches MH, ML are connected to corresponding pilot drivers DRV1, DRV2.

It is further noticed that the second conduction terminal MHs of the first electronic switch MH is connected to the first conduction terminal MLd of the second electronic switch ML, and both are connected to an output terminal Vout.

Such switches MH, Ml are turned on and off alternately by the corresponding drivers DRV1, DRV2 connecting the output Vout to the supply terminal Vdd or the ground terminal GND.

Particularly, in the example of FIG. 1A, the two electronic switches MH and ML are implemented, for example, by two power MOS transistors (or power MOS) with an "N" type channel, so as to implement the scheme of a half-bridge output stage.

The typical waveforms of such output stages are illustrated in FIG. 1B in the case of an incoming output current Iout, a null output current Iout, and an exiting output current Iout, with such currents having a direction as illustrated in FIG. 1B.

As it is noticed, the power dissipation, for each type of current Iout, occurs both by conduction (zones A, B, and C) and by switching (zones D and E).

It is worth pointing out that the conduction losses (zones A, B, and C) are due to the voltage drop at the ends of the two power MOS transistors multiplied by the current Iout.

On the other hand, the switching losses (zones D and E) are given by the product of the voltage at the ends of the power MOS transistors for the current flowing therein during the transition into an output voltage from GND to Vdd.

While neglecting the "dead zones", where both power MOS transistors are turned off, although there are losses due to the current flowing in the intrinsic diode that there is between the drain terminal and the source terminal, the conduction losses (zones A, B, and C) are independent from the switching frequency, since they only depend on the Rds(on) of the power MOS transistors.

Instead, the switching losses (zones D and E) are directly proportional to the switching frequency, and decrease as the rising and descending time of the output waveform decreases.

The parasitic elements that are associated with the package may be one of the main obstacles to reaching high efficiencies at high frequencies. For example, in the traditional packages, an example of which is illustrated in FIG. 2, comprising leads and bonding wires, these are characterized by parasitic resistances R1, R2 and inductances L1, L2 of the order of tens of milliohms and about 5 nH, respectively.

These values are such that both the conduction losses (caused by the total series resistance Rds(on) of the half bridge illustrated in FIG. 1A) and the switching losses may not be particularly reduced.

The presence of the inductance L1, L2 forces not particularly high variations of the current in the switches of the half bridge with respect to time (i.e., in the formula di/dt).

This depends on the fact that the voltage at the ends of the bonding inductance is related to the variation upon time of the current by the formula: VL=L*di/dt, where L is the value of the parasitic bonding inductance and VL is the voltage at the ends of the same bonding inductance caused by the current variation, the voltage that would be developed at the ends of the parasitic inductances, thus at the ends of the power transistors acting as switches of the half bridge. Such voltage at the ends of the bonding inductance VL may exceed the specifications for the component in the case of a high (di/dt).

Furthermore, these peaks may also cause malfunctions of other parts of the device.

The consequences of the structures that serve to decrease the factor di/dt are rise and descent times of the output waveform such that the switching losses at frequencies above some hundred kHz become the prevailing ones.

In order to minimize the power dissipated by switching, the so-called "resonating", "almost resonating" or "soft switching" switching systems exist, in which, by a further resonating LC cell besides the one that is generally present in the output filter, the transistors MH and ML of the half bridges are turned on only when the voltage at the ends thereof or the current flowing therein is null.

Generally, the circuits are more complex than those of a simple bridge, since they require additional inductances and, sometimes, converters. Furthermore, with the switching circuits of a resonating type, it is complex to have good fidelity of the PWM command in a power output.

Recently, various packages were proposed, that minimize the parasitic elements of the traditional packages. Particularly, for power devices, the so-called packages having a low parasitic inductance are indicated, particularly as regards the leads or bonding wires, such as, for example, a WLP package, which is the acronym for Wafer-Level package, or a CSP package, which is the acronym for Chip-Scale package.

Particularly, the WLP package, also with reference to FIG. 3, provides that the connection of the device to the printed board takes place through protuberances or balls of a conductor material that are grown more or less directly on the chip. Then the chip is in turn mounted flipped (flip chip), thus completely eliminating the bonding wires.

This scheme, besides reducing the parasitic resistance to values below one milliohm, reduces the parasitic inductance by a factor of about 100, from 5 nH to less than 50 pH.

The drawback of this WLP package is related to the difficulty or impossibility of dissipating the power through a true dissipater, at least in low cost systems.

In this case the heatsink is the printed circuit board on which the chip is attached. It is estimated that a WLP with 200 balls on a 2s2p circuit with standard dimensions jdec have a Rthj-a of about 20 degrees/W.

However, it has to be pointed out that, in devices with supply voltage and output currents exceeding a preset value, also considering a complete zeroing of the parasitics, the power dissipated by switching and the current peaks in standard devices of the half-bridge type, although they are driven so as to have very fast switching fronts, do not allow dissipating the power only by exploiting the printed board. Furthermore, they may make it very difficult to limit the electromagnetic emissions.

For example, consider the circuit of FIG. 3, wherein the circuit illustrated in FIG. 1A is implemented on a WLP-type package. Assume that the current is incoming, with the direction indicated in such FIG. 3 and the power MOS ML is driven with a driver (or generator) with an output resistance Rd2 equal to 1 Ohm. As per the power MOS MH, only the recirculation diode dMH, being the short circuited terminal command KHg, is used.

In this configuration, the switching losses are due to only the load of the transistor ML.

The current output by the supply generator Vdd as a function of the output current, from 0.1 A to 6.1 A is illustrated in FIG. 4. As can be noticed, the critical point is upon activating the transistor ML.

In this step, the output current flows in the recirculation diode dMH of transistor MH. In order to make it so that the Vout returns to zero, the transistor ML first discharges the charge built up in this recirculation diode dMH, which then, throughout this period, is similar to a short at the supply voltage Vdd. Again in this period, on the transistor ML the supply voltage Vdd falls, plus the direct voltage of the diode dMH. Since the current levels reached in this step may reach values of about 70 A (FIG. 4, point M), both the very high power dissipation and the problems that the current spike may cause with regards to the electromagnetic radiation are clear.

SUMMARY OF THE INVENTION

An object is to reduce or minimize this pulse, thus improving both the efficiency and the electromagnetic radiation performance.

Furthermore, another object is to increase the efficiency by reducing the switching losses, while reducing the electromagnetic radiation by virtue of the significant reduction of the current peaks involved.

Other objects, features and advantages are provided by a power electronic device including first and second electronic switches, each integrated on a package having a low parasitic inductance, a supply terminal and a ground terminal. The first conduction terminal of the first switch may be coupled with the supply terminal, and the second conduction terminal of the second electronic switch may be coupled with the ground terminal. The corresponding control terminals of the switches may be coupled to corresponding pilot drivers. The package may include first and second electric terminals, wherein the second conduction terminal of the first switch is coupled to the first electric terminal, and the first conduction terminal of the second switch is coupled to the second electric terminal. A first inductance may be interposed between the first electric terminal and the output terminal and/or a second inductance interposed between the second electric terminal and the output terminal.

BRIEF DESCRIPTION OF THE DRAWINGS

The characteristics and advantages of the present disclosure will be apparent from the following detailed description of a possible practical embodiment, which is illustrated by way of non-limiting example in the set of drawings, in which:

FIG. 1A shows an output block of a power electronic device in accordance with the prior art;

FIG. 1B shows the trend of the voltage at the output terminal of the power electronic device of FIG. 1A in the case that the output current is incoming, the output current is null, and the output current is exiting the above-mentioned power electronic device;

FIG. 2 shows a package implemented according to the prior art;

DETAILED DESCRIPTION OF THE PREFERRED EMBODIMENTS

Although it is not explicitly pointed out, the single characteristics described with reference to the specific embodiments shall be meant as accessory and/or interchangeable with other characteristics, described with reference to other implementation examples.

In the following, for the sake of description simplicity, elements already described with reference to the prior art will be indicated with the same reference number.

The present description will be explained by considering the current Iout as an incoming current in the power electronic device even if the same objects may be achieved with currents Iout exiting the power electronic devices.

Figure 5:
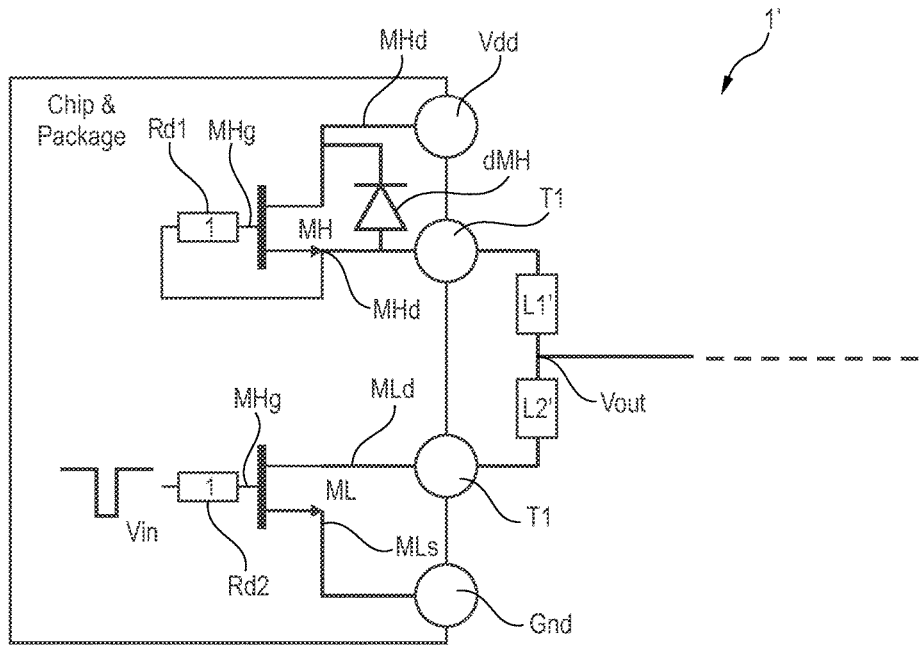
FIG. 5 shows a WLP type package in which a power electronic device in accordance with an embodiment of the present invention is implemented.

Referring now to FIG. 5, a power electronic device 1' is illustrated, which comprises a first electronic switch MH and a second electronic switch ML, in which each electronic switch MH, ML is integrated on a package of the type with low parasitic inductance of leads or bonding wires, which for example is implemented in a WLP or CSP package.

The WLP or CSP type package is known; therefore, it will not be further described. To the aims of the present description, it is worth noticing that the WLP or CSP type package has a supply terminal Vdd (for example, equal to 10V) and a ground terminal GND.

Particularly, the first and the second electronic switches MH, ML each have a first and a second conduction terminals MHd, MLd and MHs, MLs and a command or control terminal MHg, MLg.

As it is noticed from FIG. 5, the first conduction terminal MHd of the first electronic switch MH is connected with the supply terminal Vdd and the second conduction terminal MLs of the second electronic switch ML is connected with the ground terminal GND and the corresponding command terminals MHg, MLg of the first and of the second electronic switches MH, ML are connected to corresponding pilot drivers DRV1 and DRV2 (not shown in the figure).

Particularly, the WLP or CSP type package comprises first and second electric terminals T1, T2, in which the second conduction terminal MHs of the first electronic switch MH is connected to the first electric terminal T1 and the first conduction terminal MLd of the second electronic switch ML is connected to the second electric terminal T2.

It is worth noticing that the first and the second electric terminals T1, T2 are mutually connected to an output terminal Vout.

Advantageously, the electronic device 1' comprises a first inductance L1' interposed between the first electric terminal T1 and the output terminal Vout.

According to a feature of the electronic device 1', it comprises a second inductance L2' interposed between the second electric terminal T2 and the output terminal Vout.

Preferably, the electronic device 1' comprises both the first inductance L1', interposed between the first electric terminal T1 and the output terminal Vout, and the second inductance L2' interposed between the second electric terminal T2 and the output terminal Vout.

Preferably, the value of the first inductance L1' is equal to the value of the second inductance L2'.

Advantageously, the inductances L1', L2' are much higher than the parasitic inductances present in series at the Vdd and GND terminals.

Particularly, such inductances L1', L2' are implemented in values equal for example to 5 nH.

It is worth noticing that the first and the second inductances L1', L2' may be present or arranged externally or internally to the WLP type package.

In other terms, the first and the second inductances L1', L2' may be integrated in the power device 1', or implemented externally to the package on which the same power device is implemented.

In an embodiment, the first electronic switch MH and the second electronic switch ML are both implemented in an N-channel power transistor.

Therefore, the power electronic device 1' represents a switching output power stage.

Such N-channel power transistors MH and ML are connected in accordance with the half-bridge scheme, where the first electronic switch MH represents the high side of the output stage, and the second electronic switch ML represents the low side of the output stage.

Particularly, the first conduction terminal MHd, MLd of the two transistors is implemented in the drain terminal of the transistor, the second conduction terminal MHs, MLs is implemented in the source terminal of the two transistors, and the command terminal MHg, MLg is implemented in the gate terminal of the two transistors.

In FIG. 5, for the objects of the present description, the only recirculation diode dMH of the high side of the transistor MH is also illustrated.

In the following description, reference will be made only to the embodiment in which both the first inductance L1' and the second inductance L2' are implemented, always considering that the behavior of the electronic device 1 in the case that only one inductance L1' or L2' is implemented are similar.

The addition of these inductances L1' and L2' makes it so that, when the transistor ML is activated, the Vds thereof drops to potentials that are near to zero before the drain current starts rising, since all the supply voltage will drop at the inductance ends.

This allows avoiding the peak of dissipated power on ML, and avoiding the very steep current peak, which will rise by following a preset slope given by $di/dt=V/L$, where i is the current in the inductance L1' and L2', L represents the value of such inductances, and V is the voltage at the ends of the above-mentioned inductances L1' and L2'.

Figure 6:
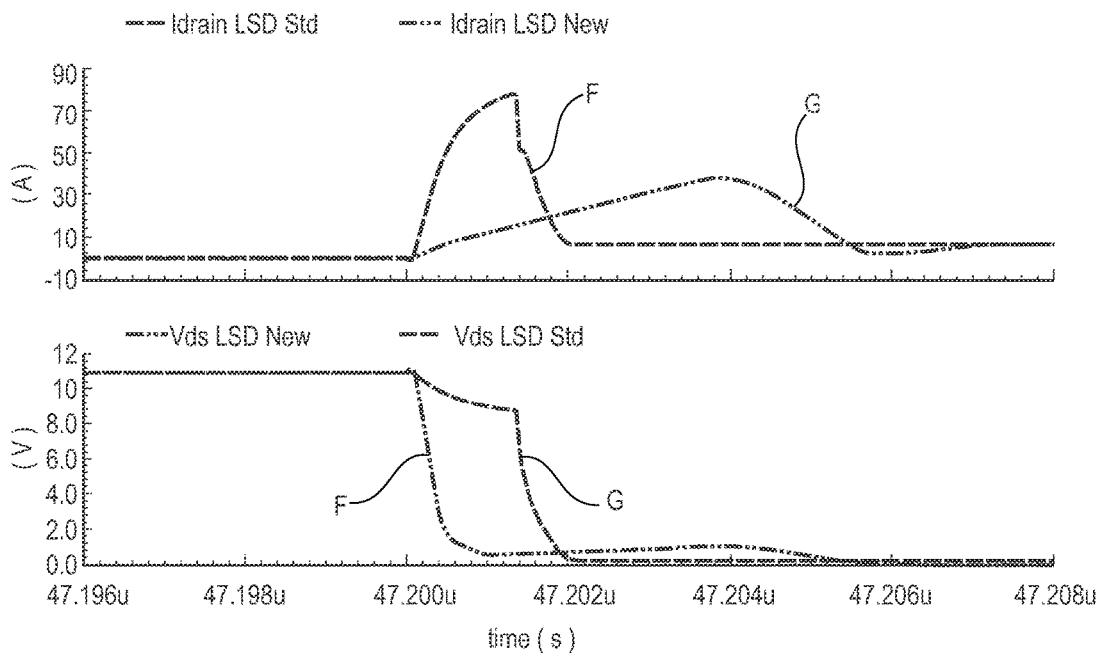
FIG. 6 shows graphs in which the trend of the output current in the case of the package of FIG. 5 is simulated.

With reference to FIG. 6, it is illustrated therein, in the top portion, the trend of the drain current and, in the bottom portion, the trend of the drain voltage of the transistor ML with the device 1 (illustrated with reference to FIG. 3, curve F) and with that of the device 1' (illustrated with reference to FIG. 5, curve G), in the case that the current Iout is equal to 6 A and the values used in the simulations are equal to 1 nH for the inductances L1' and L2', hypothesizing that the output resistances Rd1 and Rd2 of the drivers DRV1 and DRV2 are equal to 1 Ohm.

In such FIG. 5, for the sake of the simulation illustrated in FIG. 6, it is noticed that the transistor ML (i.e., the low side of the half-bridge output stage) is driven by the generator Vin, while the command or control terminal of the transistor MH (i.e., the high side of the half-bridge output stage) is short circuited.

Figure 3:
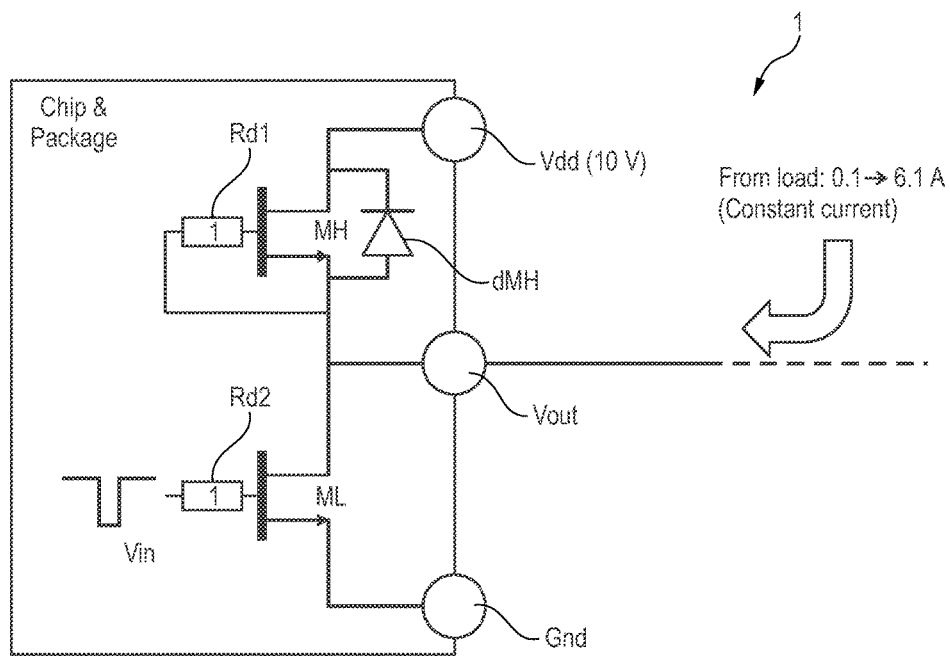
FIG. 3 shows another WLP type package in which a power electronic device according to the prior art is implemented.
Figure 4:
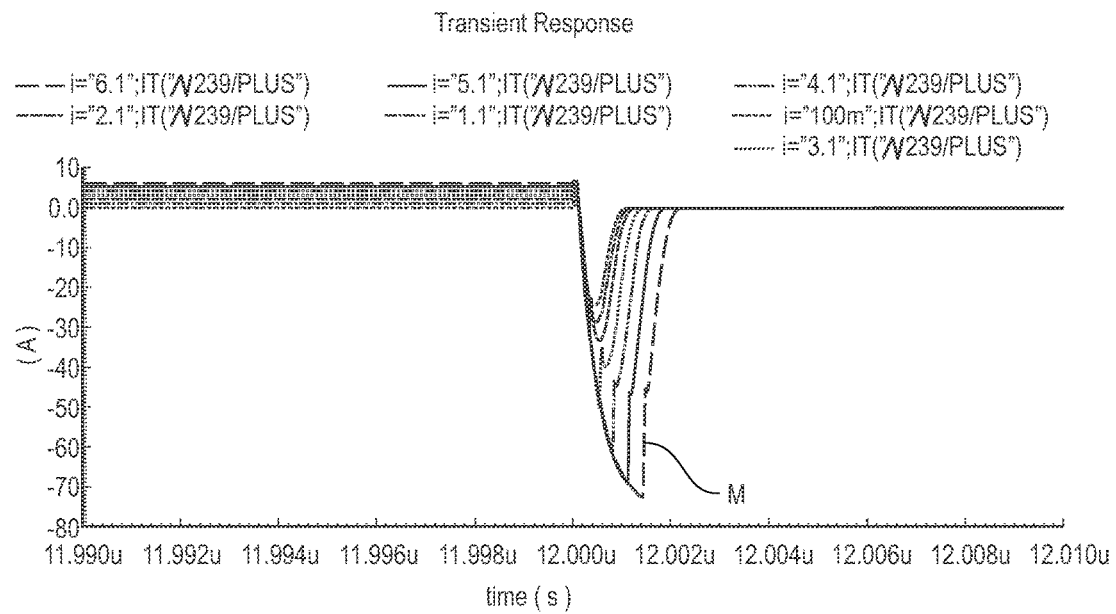
FIG. 4 shows graphs in which the trend of the supply current of the device in the case of the package of FIG. 3 is simulated.

From the simulation of FIG. 6, it is noticed that the device 1 of FIG. 3 has a current peak value of about 70 A, while in the device 1' of FIG. 5 the current peak value is noticeably reduced, and equal to about 35 A.

Therefore, by virtue of the insertion of at least one inductance L1' or L2', preferably both, a reduction of the amplitude and the slope of the current pulse due to the recirculation diode dMH of the MOS transistor of the high side, i.e., of the switch MH is achieved.

The maintenance of the current peak at 35 A in the embodiment of the electronic power device 1' illustrated with reference to FIG. 5, while being lower than that of the prior art, is however due to the fact that the energy is stored in the inductances L1' and L2' and it is then released to the same device. This phenomenon may cause a corresponding voltage spike that may exceed the breakdown limits of the power transistors MH and ML.

Figure 7:
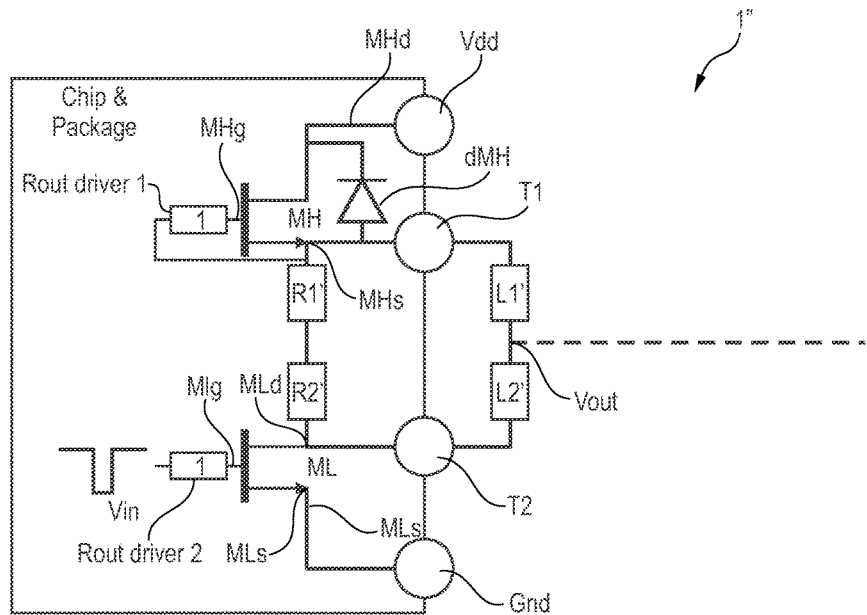
FIG. 7 shows a WLP type package in which a power electronic device in accordance with another embodiment of the present disclosure is implemented.

In order to limit such a voltage spike, and with reference to FIG. 7, an embodiment of the power electronic device 1" is illustrated, which further comprises, with respect to the device 1' of FIG. 5, at least one resistive member R1', R2'.

Such at least one resistive member R1', R2' turns out to be connected between the second conduction terminal MHd of the first electronic switch MH and the first conduction terminal MLd of the second electronic switch ML.

Preferably, two resistive members R1' and R2' are implemented, which are arranged mutually in series, and connected between the second conduction terminal MHd of the first electronic switch MH and the first conduction terminal MLd of the second electronic switch ML.

Such resistive members R1' and R2' act as damping resistances.

Particularly, the resistive members R1' and R2' are preferably arranged inside the WLP or CSP package, i.e., integrated in the electronic device 1", so as to have negligible parasitic inductances.

In an alternative embodiment, the common point of the resistive members R1' and R2' may be connected to the common point of the two inductances L1', L2'. However, the latter approach is generally more complex, since it requires, in the case that L1' and L2' are outside the package, a further connection between the inside and the outside of the chip itself.

For example, the values of R1' and R2' may be of the order of a few Ohms.

The presence of the resistances R1' and R2' involves an efficiency reduction for the device, which is consistent with that of the prior art circuit as illustrated in FIG. 3.

However, it is known from U.S. Pat. No. 7,332,943, by the name of the same Applicant of the present application, and incorporated in its entirety herein by reference, that the addition of a non-null voltage Vgs at the high side MH of the half-bridge switching output stage, in the devices 1' and 1" of FIGS. 5 and 7, respectively, allows obtaining a reduction of the conduction of the recirculation diode dMH.

Such operation is described with reference to FIG. 8, in which at the high side (i.e., transistor MH) of the device illustrated in FIG. 3, the voltage generator V(off) was added. In fact, by virtue of the addition of the non-null voltage of the power MOS MH under interdiction conditions (i.e., "Off"), a considerable reduction of the current peak relative to this phenomenon is obtained.

The drawback in inserting the voltage generator V(off) is the output resistance of the pilot generator Rd of the gate-source voltage that, to avoid restarting operations of MH, caused by the high dv/dt of the output voltage and the parasitic capacitance Cgd, has to be very small, for example, below 1 Ohm.

This also depends on the fact that the capacitance Cgd, during the descent transient of the output voltage of the transistor MH from the supply voltage value Vdd to zero, is charged with the current that is provided essentially by the driving circuit, i.e., the driver V(off).

The voltage drop on the output resistance Rd of this circuit may increase the voltage Voff at the output terminal to values higher than the threshold values Vth of the transistor, causing the cross-conduction pulses between MH and MI.

Figure 8:
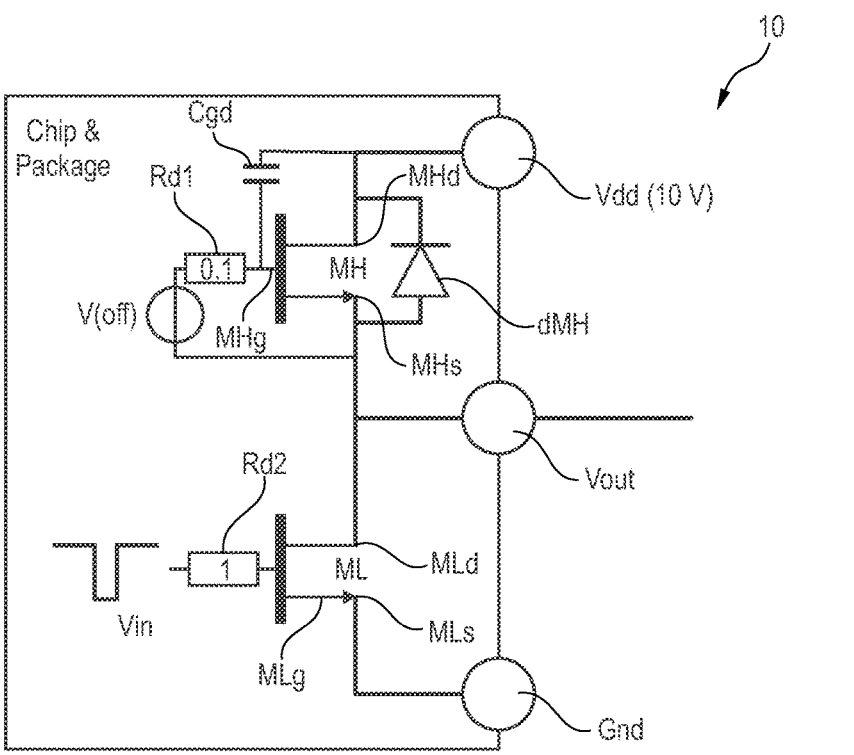
FIG. 8 shows a WLP type package in which a power electronic device in accordance with the present disclosure is implemented.

In FIG. 8, the resistance Rd was set as equal to 0.1 ohm; in fact, it is essentially impossible to obtain so low a value for the output resistance of the generator V(off).

Figure 9:
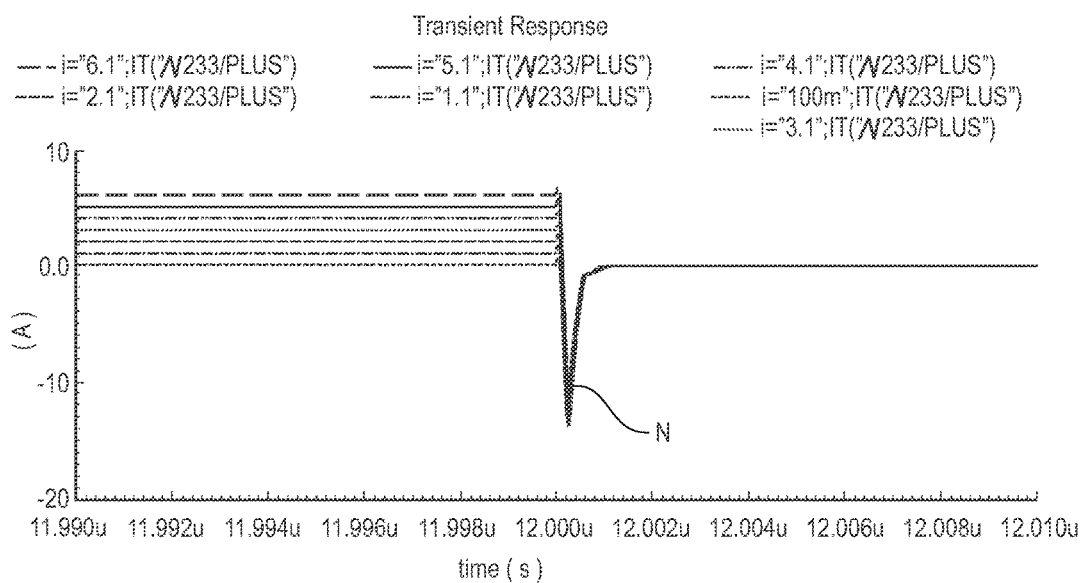
FIG. 9 shows graphs in which the trend of the supply current of the device in the case of the package of FIG. 8 is simulated.

Furthermore, it is worth noticing that, also with such value of Rd equal to 0.1 ohm, a certain contribution to the voltage spike due to spurious re-starting is present as shown in FIG. 9.

In fact, in FIG. 9 it is noticed that the current spike (point N) is reduced to about 13 A, i.e., a value that is lower with respect to the prior art device illustrated in FIG. 3, but which however represents a value that may not be neglected, and that may be an origin of problems for other circuits in the power device.

Figures 10A, 10B:
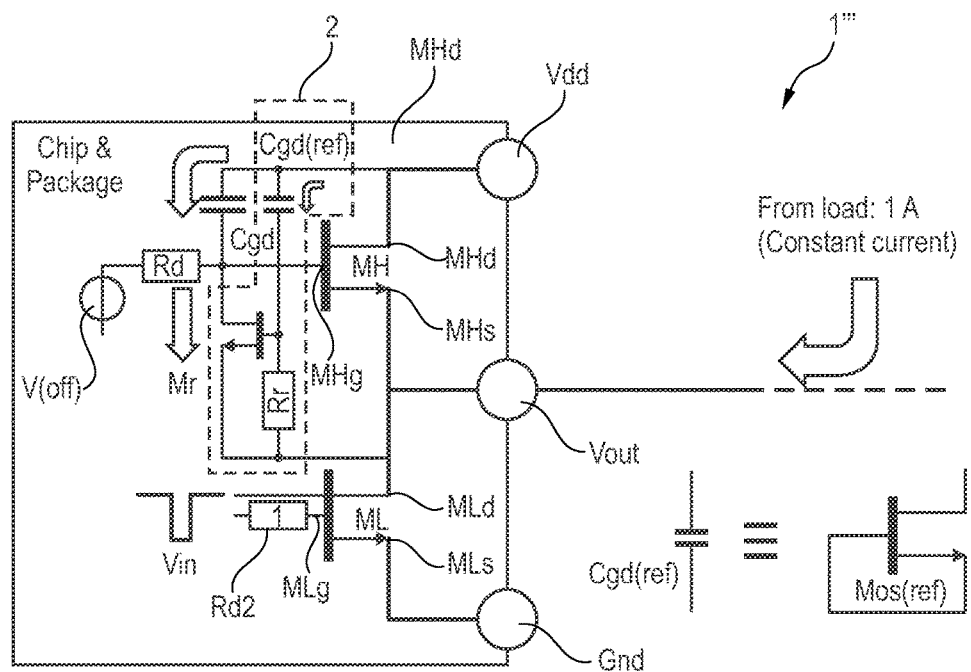
FIGS. 10A and 10B show, respectively, a WLP type package in which a power electronic device in accordance with a further embodiment of the present disclosure and an exemplary embodiment of an element of the circuit of FIG. 10A are implemented.

Independently from the embodiments of the power electronic device illustrated in FIGS. 5 and 7 and with reference to FIG. 10A, when it is desired to further improve the efficiency and electromagnetic radiation performance of the power device 1 of FIG. 3, it may be hypothesized to compensate the current circulating in Rd by the addition of a compensation circuit 2 so as to obtain a power device 1'" with noticeably improved performance.

Particularly, such compensation circuit 2 comprises: capacitive means or capacitor 3 dimensioned as a function of a parasitic capacitance existing between the command terminal MHg and the first conduction terminal MHd of the first electronic switch MH, i.e., the parasitic capacitance Cgd set forth above. The circuit 2 may also include an electronic switch MR having a command terminal MCg and a first and second conduction terminals MRd, MRs.

In particular, the capacitive means or capacitor 3 is connected with the command terminal MCg of the electronic switch MR in order to activate it, so that the current circulating in electronic switch MR compensates the current circulating in the parasitic capacitance Cgd during the descent transient of the output voltage Vout, present at the output terminal, from the value of the voltage present at the supply terminal Vdd to the value of the voltage at the ground terminal GND.

It is worth noticing that between the command terminal MRg of the electronic switch MR and the second conduction terminal MRs of such electronic switch MR, a resistance Rr is present. Such resistance Rr acts as an anti-leakage device, i.e., it avoids "floating" of the command terminal MRg of the MOS MR. This scenario is to be avoided, because the MOS MR could turn on also under undesired conditions. The resistance Rr imposes the minimum current in Cgd(ref) so that the MOS MR turns on, equal to Vgs(thresholdMr)/Rr.

Particularly, according to a preferred embodiment, the capacitive means or capacitor 3 are proportional to the parasitic capacitance Cgd of the first switch MH and are implemented in a capacitance Cgd(ref) or in a N-type channel MOS transistor, as exemplified in FIG. 10B.

Particularly, according to a preferred embodiment, the electronic switch MC is implemented in an N-type channel power transistor.

It is worth noticing that the capacitance Cgd(ref) is proportional to the parasitic capacitance Cgd of the high side of the output stage (transistor MH) and it is dimensioned so it is able to turn the N-type channel power transistor on with which the electronic switch MR is implemented.

By operating in such a manner, it is possible to compensate the gate current, since, if the drain current MR actuated by the current circulating in the capacitance Cgd(ref) is higher than or equal to the current circulating in the parasitic capacity Cgd, then the voltage Vgs of the transistor MH remains constant or decreases, avoiding the cross-conduction current pulse.

Figure 11:
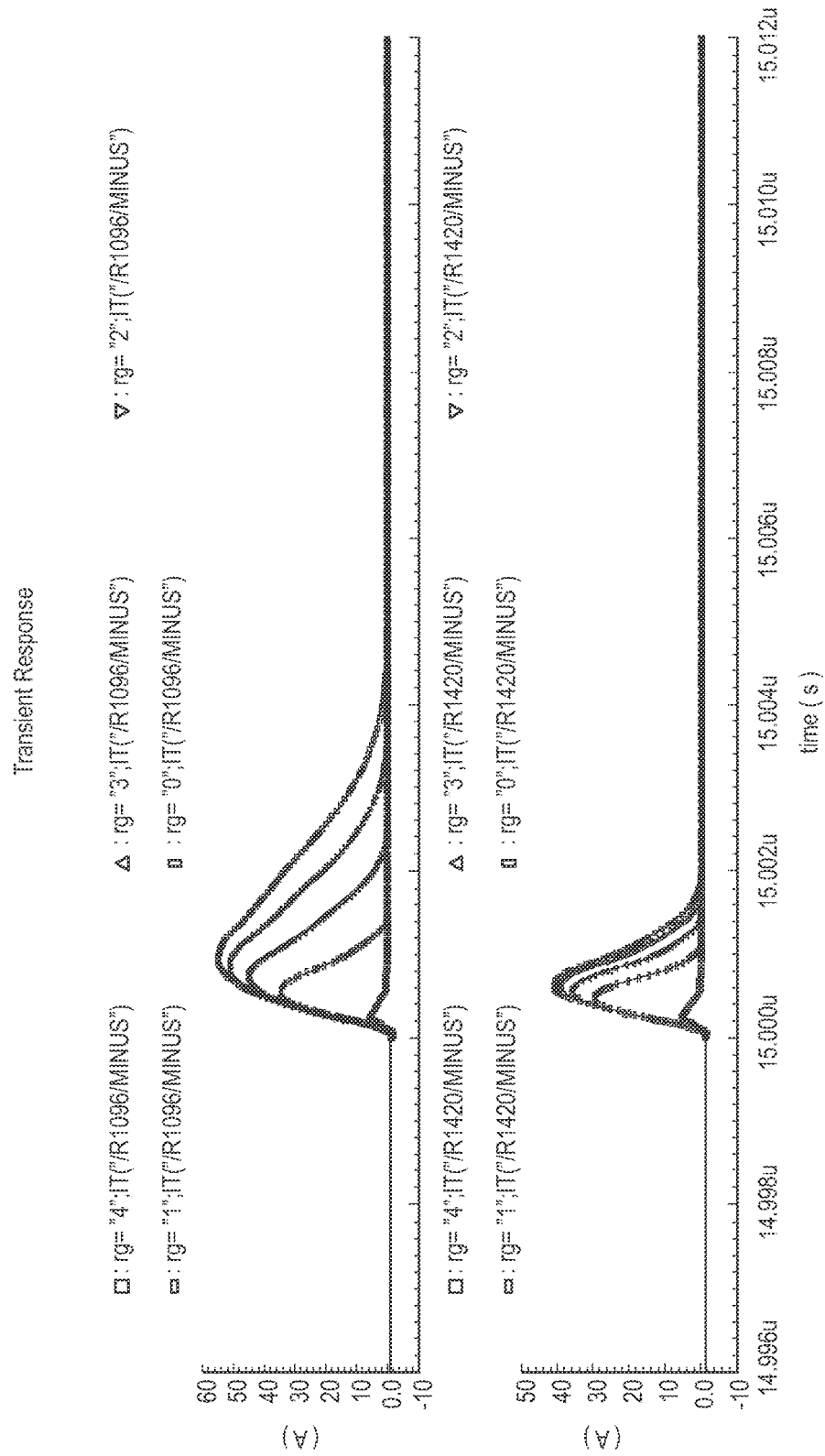
FIG. 11 shows graphs in which the trend of the current is simulated, in the device of FIG. 10A.

The result of inserting the compensation circuit 2 is illustrated in the simulation of FIG. 11, where the cross-conduction pulses are indicated as the resistance Rd increases from zero to four Ohms of the: upper portion of the graph: power device 1 (cf. FIG. 3) without compensation circuit 2 for the current circulating in the power MOS MH, and bottom portion of the graph: power device 1''' (cf. FIG. 10A) with compensation circuit 2 for the current circulating in the power MOS MH.

As it is noticed, the compensation caused by such compensation circuit 2 is noticeable, since the peak current is below 10 A; however, a time offset exists before such compensation circuit 2 actually intervenes. Such offset may be assessed on the order of ten nanoseconds, and in the specific case of FIG. 10A, with the values indicated above, it is equal to about 2 nsec.

Figure 12:
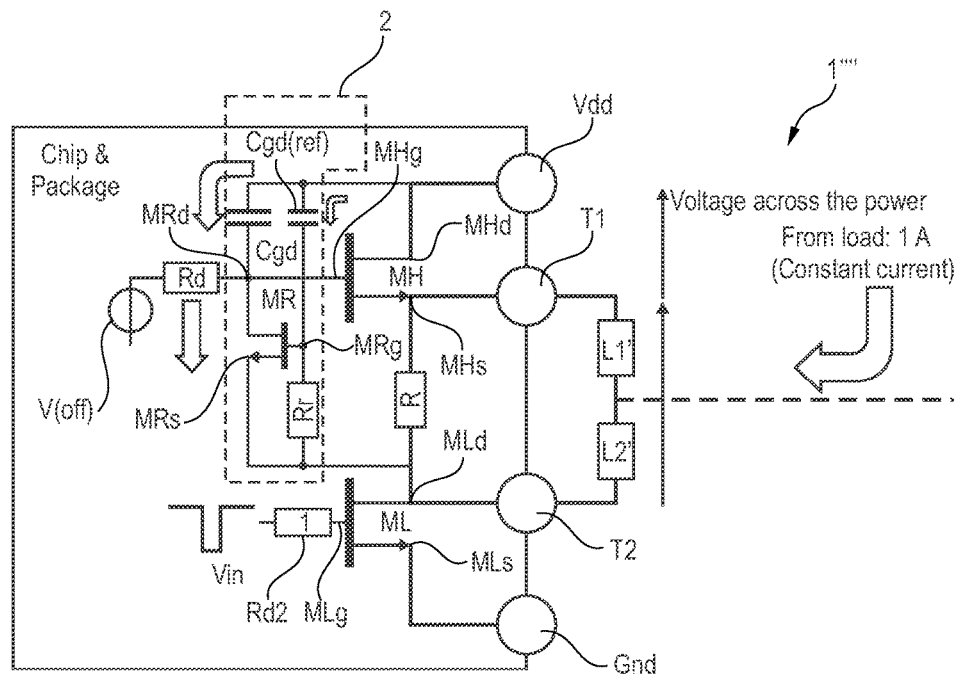
FIG. 12 shows a WLP type package in which a further embodiment of the power electronic device in accordance with the present disclosure is implemented.

Referring now to FIG. 12, a further embodiment of the power electronic device 1'''' is shown.

Advantageously, according to a characteristic aspect of the present description, to the power device 1'' described with reference to FIG. 7, the compensation circuit 2 described with reference to FIG. 10A is added.

Such power device 1'''' allows obtaining that on the capacitive means Cgd(ref) also the voltage present at the ends of the inductances L1' and L2' falls, therefore obtaining an anticipation of the intervention of the drain current of MR so as to practically nullify the cross-conduction pulse, by making it almost independent from the value of the resistance Rd.

Figure 13:
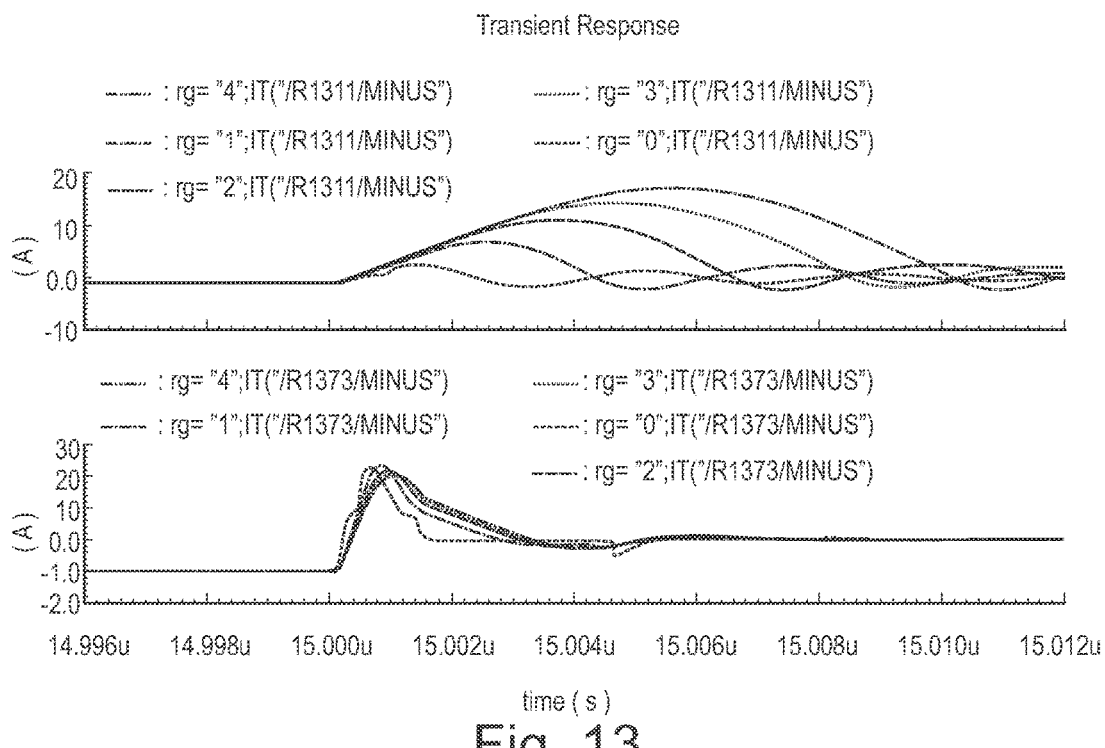
FIGS. 13, 14, 15, 16, and 17 show various graphs in which various parameters of the devices illustrated in FIGS. 3, 7, and 12 are simulated.

The result of introducing the compensation circuit 2 in the electronic device 1'' is illustrated in the simulations of FIG. 13, where the cross-conduction pulses are indicated as the resistance Rd increases from zero to four Ohms, without the compensation circuit 2 for the current circulating in the power MOS MH (upper portion of the graph) and with the compensation circuit 2 (bottom portion of the graph).

Figure 14:
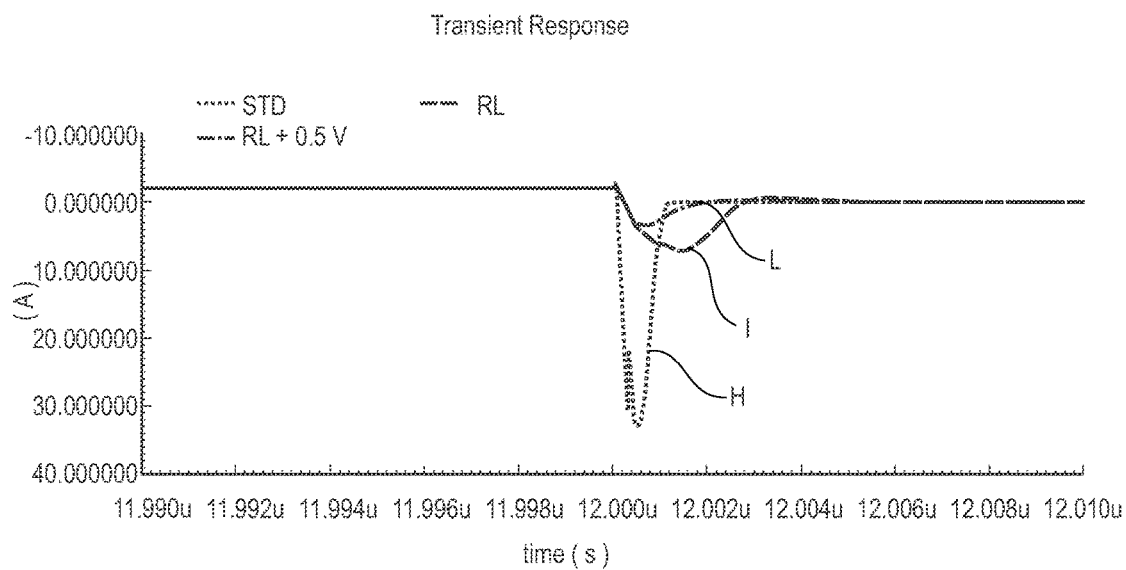

Referring now to FIG. 14, a graph is illustrated therein, which shows the trend of the pulse of the current outputted by the supply Vdd for the half bridge of the device 1, 1'' and 1'''', considering an incoming current value equal to 2 A. To this aim, in FIG. 14, the illustrated cases are exactly the device 1 of FIG. 3 indicated with H, the device 1'' of FIG. 7 indicated, with I, and the device 1'''' of FIG. 12 indicated with L.

Figure 15:
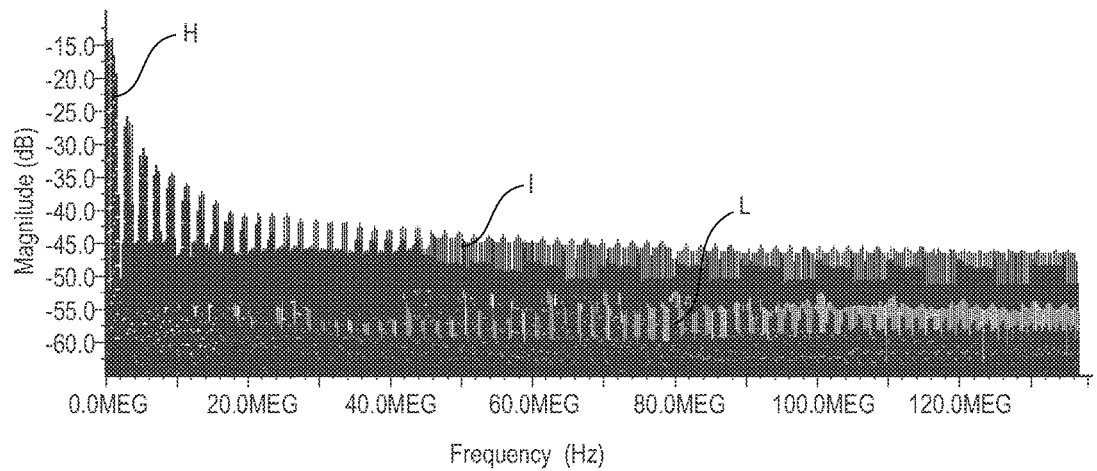
Figure 16:
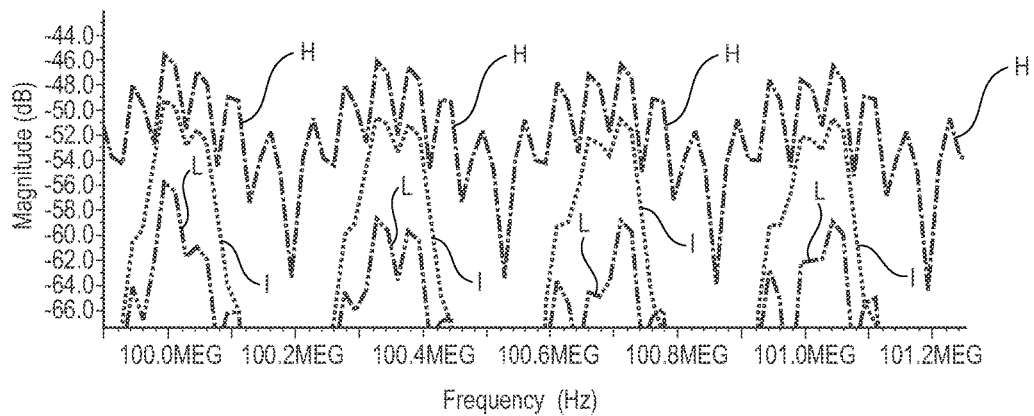

Referring now to the FIGS. 15 and 16, the trend of the Fast Fourier Transform of the current pulse outputted by the supply Vdd for the half bridge of the device 1, 1'' and 1'''', with a frequency of 333 kHz is shown.

As it is noticed, the reduction of the amplitudes of the harmonics with respect to the standard case 1 is apparent. In the critical zone around 100 MHz (which is the frequency modulation transmission band) is about a minimum of 5 dB for the case of the device 1'' and it is higher than 10 dB for the case of the device 1''''.

Figure 17:
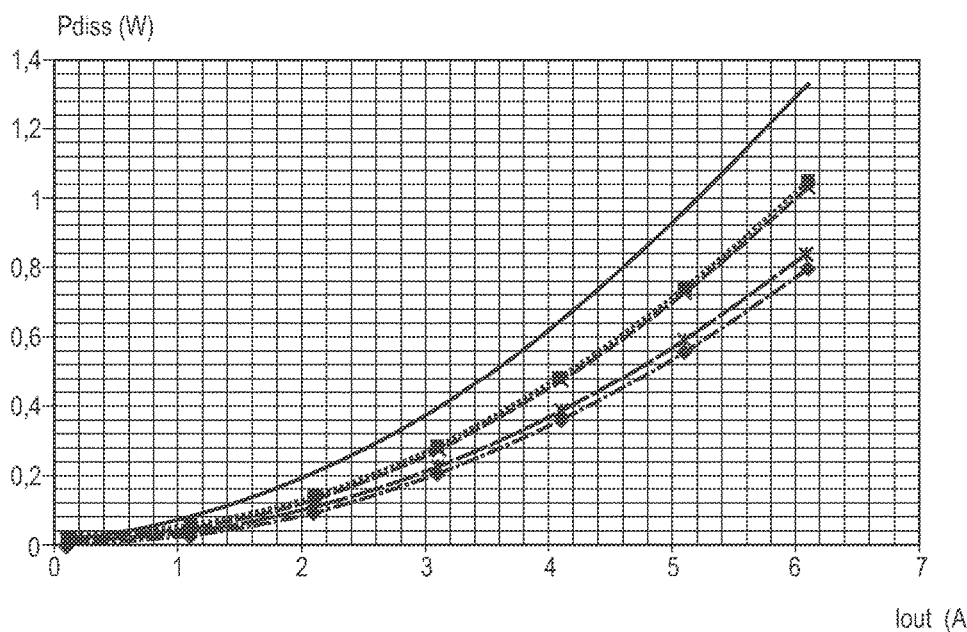

Instead, referring now to FIG. 17, the advantage that can be obtained with the power device 1'''' as regards to the dissipated power of the low side ML, including the added dumping resistances is shown.

Particularly, the comparison was performed with respect to the dissipation due only to the Rds(on) of the transistor ML and a device described with respect to FIG. 1 when driven in a less quick manner (i.e., with Rd=20 Ohm). Particularly, it is noticed that the electronic device 1'''' of FIG. 12 has a dissipation that approximates to the ideal case.

Figure 18:
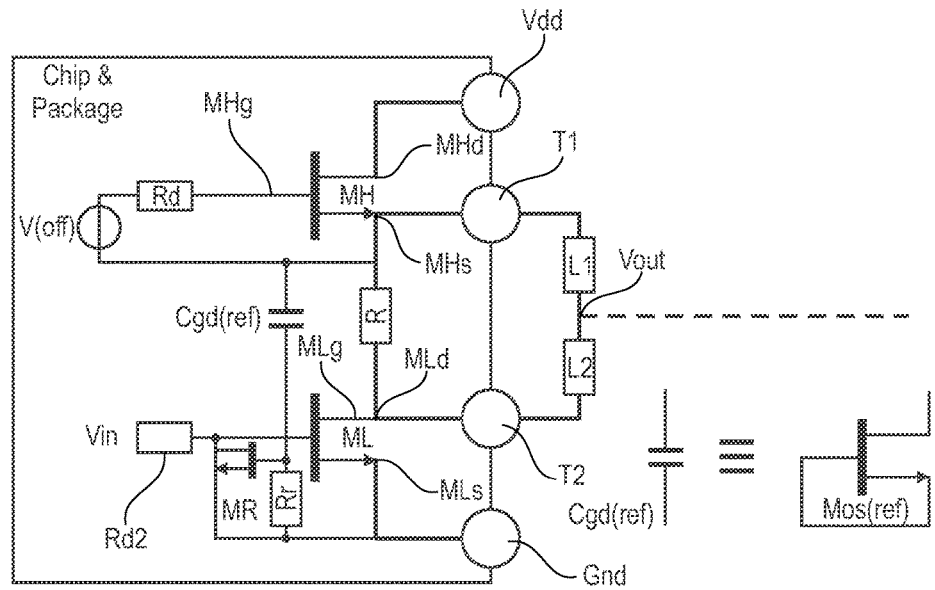
FIGS. 18 and 19 show, respectively, a further embodiment of the WLP type package in which another power electronic device in accordance with the present disclosure is implemented.

Referring now to FIG. 18, a possible alternative embodiment of the electronic device 1''' illustrated in FIG. 12 is illustrated. Particularly, in FIG. 18, the implementation of the compensation circuit 2 when associated to the transistor ML of the output stage, i.e., in relation to the low side transistor, is shown.

In general, the compensation circuit 2 will be able to be implemented only on the high side of the output stage of the electronic device 1'''' (i.e., transistor MH), only on the low side of the output stage of the electronic device 1'''' (i.e., transistor ML), or on both the power transistors according to the fact that the output current Iout can be only incoming, only exiting, or it can take both polarities.

Furthermore, it is worth noticing that both the electronic device 1'''' described with reference to FIG. 12 and the electronic device 1'' described with reference to FIG. 7 may be implemented in switching stages that employ P-type channel power MOS transistors (i.e., the output stage uses both P-type channel power MOS transistors for the Low Side and for the High Side).

Typically, the P-type channel power MOS transistor is used for implementing the switch MH because it has the advantage of not requiring a driving of the gate that has to exceed the supply voltage Vdd, as it has instead to be done in the case that the switch MH is implemented with an N-type channel power MOS transistor.

Figure 19:
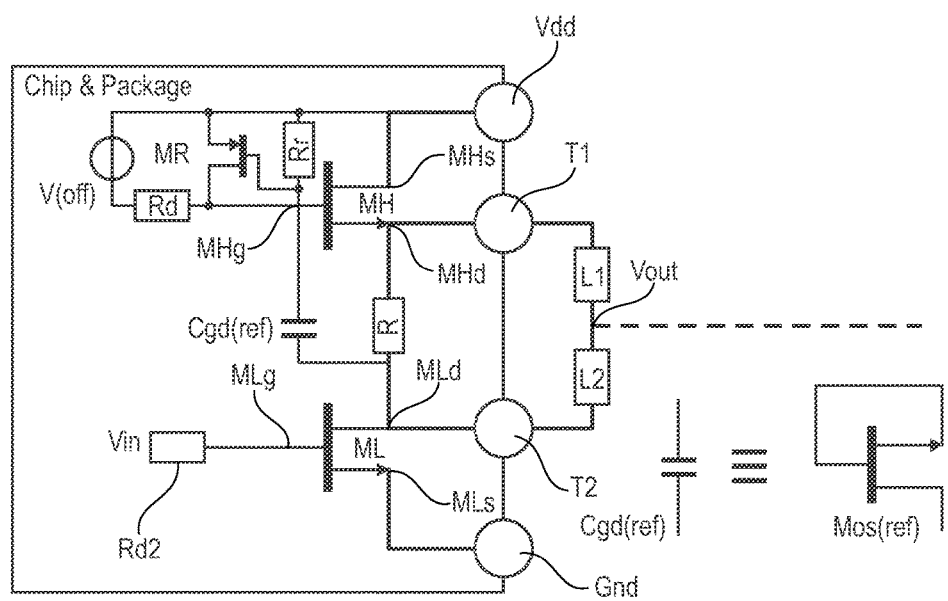

In the latter case, also with reference to FIG. 19, the P-type channel power MOS transistor, i.e., the switch MH, will have the source terminal MHs connected to the supply terminal Vdd and the drain terminal MHd connected to the output terminal Vout.

It is worth noticing that the electronic device 1'''' described with reference to FIG. 12 or the electronic device 1'' described with reference to FIG. 7 is however operating also with exiting currents Iout and/or a P-type channel power MOS transistor instead of the N-type channel power MOS transistor of the switch MH (i.e., of the High Side).

It shall apparent that those of ordinary skill in the art, in order to meet contingent, specific needs, will be able to make a number of modifications and variations described above, all of which anyhow falling within the protection scope as defined by the following claims.

The invention claimed is:
1. A power electronic device comprising:
a package having a supply terminal and a reference terminal;
first and second drivers;
a first electronic switch and a second electronic switch being integrated on said package, each of said first and second electronic switches having a first conduction terminal, a second conduction terminal, and a control terminal, the first conduction terminal of said first electronic switch being coupled with the supply terminal, and the second conduction terminal of said second electronic switch being coupled with the reference terminal, control terminals of said first and second electronic switches being coupled to respective ones of said first and second drivers;

at least one resistive member coupled between the second conduction terminal of said first electronic switch and the first conduction terminal of said second electronic switch to allow a bidirectional flow of current therebetween;

said package comprising a first terminal coupled to the second conduction terminal of the first electronic switch, a second terminal coupled to the first conduction terminal of said second electronic switch, and an output terminal;

a first inductance coupled between the first terminal and said output terminal;

a second inductance coupled between the second terminal and the output terminal; and said package comprising at least one of a wafer-level package and a chip-scale package, with said package configured to be directly coupled to a printed circuit board so as to eliminate bonding wires and reduce parasitic inductance.

2. The power electronic device in accordance with claim 1, wherein said first and said second inductances are arranged externally of said package.

3. The power electronic device in accordance with claim 1, wherein said first and said second inductances are arranged internally of said package.

4. The power electronic device in accordance with claim 1, wherein the supply terminal and reference terminal have respective parasitic inductances associated therewith; and wherein said first and second inductances are higher than the respective parasitic inductances.

5. The power electronic device in accordance with claim 1, wherein said at least one resistive member is arranged internally to said package.

6. The power electronic device in accordance with claim 1, further comprising:
a compensation circuit comprising
at least one capacitor having a value based upon a parasitic capacitance existing between said control terminal and said first conduction terminal of said first electronic switch,
a third electronic switch having a control terminal and first and second conduction terminals, and
said at least one capacitor coupled with the control terminal of said third switch for activating it, so that current circulating in said third electronic switch compensates current circulating in said parasitic capacitance during the descent transient of the voltage of the output terminal from the voltage value at the supply terminal to the voltage value at the ground terminal.

7. The power electronic device in accordance with claim 6, wherein said at least one capacitor is dimensioned in a proportional manner with said parasitic capacitance.

8. The power electronic device in accordance with claim 6, wherein said at least one capacitor is coupled with said first conduction terminal of said first electronic switch and with said control terminal of said third electronic switch, while said first conduction terminal of said third electronic switch is coupled with said first conduction terminal of said first electronic switch and said second conduction terminal of said third electronic switch is coupled with said second conduction terminal of said first electronic switch.

9. The power electronic device in accordance with claim 6, further comprising at least one resistor coupled between said control terminal of said third electronic switch and said second conduction terminal of said first electronic switch.

10. The power electronic device in accordance with claim 6, wherein said at least one capacitor is coupled with said first conduction terminal of said second electronic switch and with said control terminal of said third electronic switch, while said first conduction terminal of said third electronic switch is coupled with said control terminal of said second electronic switch and said second conduction terminal of said third electronic switch is coupled with said second conduction terminal of said second electronic switch.

11. The power electronic device in accordance with claim 10, further comprising at least one resistor coupled between said control terminal of said third electronic switch and said second conduction terminal of said second electronic switch.

12. The power electronic device in accordance with claim 6, wherein each of said first electronic switch, said second electronic switch, and said third electronic switch comprises a high-voltage and N-channel switching MOS transistor.

13. The power electronic device in accordance with claim 6, wherein said second electronic switch comprises a high-voltage N-channel switching MOS transistor; and wherein each of said first electronic switch and said third electronic switch comprises a high-voltage P-channel switching MOS transistor.

14. A power electronic device comprising:
a package having a supply terminal and a reference terminal;
first and second pilot drivers;
a first electronic switch and a second electronic switch being integrated on said package, each of said first and second electronic switches having a first conduction terminal, a second conduction terminal, and a control terminal, the first conduction terminal of said first electronic switch being coupled with the supply terminal, and the second conduction terminal of said second electronic switch being coupled with the reference terminal, control terminals of said first and second electronic switches being coupled to respective ones of said first and second pilot drivers;
at least one resistive member coupled between the second conduction terminal of said first electronic switch and the first conduction terminal of said second electronic switch to allow a bidirectional flow of current therebetween;
said package comprising a first terminal coupled to the second conduction terminal of the first electronic switch, a second terminal coupled to the first conduction terminal of said second electronic switch, and an output terminal;
a first inductance coupled between the first terminal and said output terminal; and
a second inductance coupled between the second terminal and the output terminal;
said package comprising at least one of a wafer-level package and a chip-scale package, with said package configured to be directly coupled to a printed circuit board so as to eliminate bonding wires.

15. The power electronic device in accordance with claim 14, wherein said first and said second inductances are arranged externally of said package.

16. The power electronic device in accordance with claim 14, wherein said first and said second inductances are arranged internally of said package.

17. The power electronic device in accordance with claim 14, wherein the supply terminal and reference terminal have respective parasitic inductances associated therewith; and wherein said first and second inductances are higher than the respective parasitic inductances.

18. The power electronic device in accordance with claim 14, further comprising:
a compensation circuit comprising
at least one capacitor having a value based upon a parasitic capacitance existing between said control terminal and said first conduction terminal of said first electronic switch,
a third electronic switch having a control terminal and first and second conduction terminals, and
said at least one capacitor coupled with the control terminal of said third switch for activating it, so that current circulating in said third electronic switch compensates current circulating in said parasitic capacitance during the descent transient of the voltage of the output terminal from the voltage value at the supply terminal to the voltage value at the ground terminal.

19. The power electronic device in accordance with claim 14, wherein said package comprises a wafer-level package.

20. The power electronic device in accordance with claim 14, wherein said package comprises a chip-scale package.

21. A method for making a power electronic device comprising:
integrating a first electronic switch and a second electronic switch on a package, each of the first and second electronic switches having a first conduction terminal, a second conduction terminal, and a control terminal, the first conduction terminal of the first electronic switch being coupled with the supply terminal, and the second conduction terminal of the second electronic switch being coupled with the reference terminal, control terminals of the first and second electronic switches being coupled to respective ones of first and second drivers;
coupling at least one resistive member coupled between the second conduction terminal of the first electronic switch and the first conduction terminal of the second electronic switch to allow a bidirectional flow of current therebetween;
wherein the package comprises a first terminal coupled to the second conduction terminal of the first electronic switch, a second terminal coupled to the first conduction terminal of the second electronic switch, and an output terminal,
coupling a first inductance between the first terminal and the output terminal;
coupling a second inductance between the second terminal and the output terminal; and
the package comprising at least one of a wafer-level package and a chip-scale package, with the package configured to be directly coupled to a printed circuit board so as to eliminate bonding wires.

22. The method in accordance with claim 21, wherein the first and the second inductances are arranged externally of the package.

23. The method in accordance with claim 21, wherein the first and the second inductances are arranged internally of the package.

24. The method in accordance with claim 21, wherein the supply terminal and reference terminal have respective parasitic inductances associated therewith; and wherein the first and second inductances are higher than the respective parasitic inductances.

25. The method in accordance with claim 21, wherein the package comprises a wafer-level package.

26. The method in accordance with claim 21, wherein the package comprises a chip-scale package.

27. A power electronic device comprising:
a package having a supply terminal and a reference terminal;
first and second drivers;
a first electronic switch and a second electronic switch being integrated on said package, each of said first and second electronic switches having a first conduction terminal, a second conduction terminal, and a control terminal, the first conduction terminal of said first electronic switch being coupled with the supply terminal, and the second conduction terminal of said second electronic switch being coupled with the reference terminal, control terminals of said first and second electronic switches being coupled to respective ones of said first and second drivers;
at least one resistive member coupled between the second conduction terminal of said first electronic switch and the first conduction terminal of said second electronic switch to allow a bidirectional flow of current therebetween;
said package comprising a first terminal coupled to the second conduction terminal of the first electronic switch, a second terminal coupled to the first conduction terminal of said second electronic switch, and an output terminal;
a first inductance coupled between the first terminal and said output terminal;
said package comprising at least one of a wafer-level package and a chip-scale package, with said package configured to be directly coupled to a printed circuit board so as to eliminate bonding wires and reduce parasitic inductance; and
a compensation circuit comprising
at least one capacitor having a value based upon a parasitic capacitance existing between said control terminal and said first conduction terminal of said first electronic switch,
a third electronic switch having a control terminal and first and second conduction terminals, and
said at least one capacitor coupled with the control terminal of said third switch.

28. The power electronic device in accordance with claim 27, wherein said at least one capacitor is configured to activate said third electronic switch so that current circulating therein compensates current circulating in said parasitic capacitance during the descent transient of the voltage of the output terminal from the voltage value at the supply terminal to the voltage value at the ground terminal.

29. The power electronic device in accordance with claim 27, wherein said at least one capacitor is dimensioned in a proportional manner with said parasitic capacitance.

30. The power electronic device in accordance with claim 27, wherein said at least one capacitor is coupled with said first conduction terminal of said first electronic switch and with said control terminal of said third electronic switch, while said first conduction terminal of said third electronic switch is coupled with said first conduction terminal of said first electronic switch and said second conduction terminal of said third electronic switch is coupled with said second conduction terminal of said first electronic switch.

31. The power electronic device in accordance with claim 27, further comprising at least one resistor coupled between said control terminal of said third electronic switch and said second conduction terminal of said first electronic switch.

32. The power electronic device in accordance with claim 27, wherein said at least one capacitor is coupled with said first conduction terminal of said second electronic switch and with said control terminal of said third electronic switch, while said first conduction terminal of said third electronic switch is coupled with said control terminal of said second electronic switch and said second conduction terminal of said third electronic switch is coupled with said second conduction terminal of said second electronic switch.

33. The power electronic device in accordance with claim 31, further comprising at least one resistor coupled between said control terminal of said third electronic switch and said second conduction terminal of said second electronic switch.

34. The power electronic device in accordance with claim 27, wherein each of said first electronic switch, said second electronic switch, and said third electronic switch comprises a high-voltage and N-channel switching MOS transistor.

35. The power electronic device in accordance with claim 27, wherein said second electronic switch comprises a high-voltage N-channel switching MOS transistor; and wherein each of said first electronic switch and said third electronic switch comprises a high-voltage P-channel switching MOS transistor.

* * * * *